US006509813B2

United States Patent
Ellä et al.

(10) Patent No.: US 6,509,813 B2
(45) Date of Patent: Jan. 21, 2003

(54) BULK ACOUSTIC WAVE RESONATOR WITH A CONDUCTIVE MIRROR

(75) Inventors: Juha Ellä, Halikko (FI); Jyrki Kaitila, Helsinki (FI)

(73) Assignee: Nokia Mobile Phones Ltd., Espoo (FI)

( * ) Notice: Subject to any disclaimer, the term of this patent is extended or adjusted under 35 U.S.C. 154(b) by 16 days.

(21) Appl. No.: 09/761,171

(22) Filed: Jan. 16, 2001

(65) Prior Publication Data

US 2002/0093398 A1 Jul. 18, 2002

(51) Int. Cl.[7] .................. H03H 9/15; H03H 9/56; H03H 3/007
(52) U.S. Cl. ............. 333/187; 333/191; 29/25.35; 310/321; 310/324; 310/348
(58) Field of Search .................. 333/186–192, 333/133; 310/324, 321, 348, 349, 351; 29/25.35

(56) References Cited

U.S. PATENT DOCUMENTS

| | | | | |
|---|---|---|---|---|
| 4,166,967 A | * | 9/1979 | Benes et al. ............ | 310/338 |
| 5,373,268 A | * | 12/1994 | Dworsky et al. .......... | 333/187 |
| 5,714,917 A | | 2/1998 | Ella ..................... | 332/144 |
| 5,864,261 A | * | 1/1999 | Weber ................... | 333/187 |
| 5,872,493 A | * | 2/1999 | Ella ..................... | 333/191 |
| 5,873,154 A | | 2/1999 | Ylilammi et al. ......... | 29/25.35 |
| 5,910,756 A | | 6/1999 | Ella ..................... | 333/133 |
| 6,060,818 A | | 5/2000 | Ruby et al. ............. | 310/363 |
| 6,087,198 A | * | 7/2000 | Panasik ................. | 438/51 |

FOREIGN PATENT DOCUMENTS

EP 0 963 000 A2 * 12/1999

OTHER PUBLICATIONS

"Thin Film ZnO Based Bulk Acoustic Mode Filters," by C. Seabury, P. Kobrin, R. Addison and D. Havens from *IEEE MTT–S Digest*, Jun. 1997, pp. 181–84.
"FBAR Technology Shrinks CDMA Handset Duplexers," by D. McNamara, from *Microwaves & RF*, Sep. 2000, pp. 71–79.

* cited by examiner

Primary Examiner—Robert Pascal
Assistant Examiner—Barbara Summons
(74) Attorney, Agent, or Firm—Ware, Fressola, Van Der Sluys & Adolphson LLP (57) ABSTRACT

A method of fabricating a bulk acoustic wave (BAW) resonator and a BAW resonator so fabricated, the method including the steps of: providing a substrate; providing a first isolation structure; and providing a resonator section including a piezolayer; wherein the first isolation structure includes an acoustic mirror made from only electrically conductive layers of alternating high and low acoustic impedance. In some applications, the first isolation structure is situated between the resonator section and the substrate, while in other applications, the first isolation structure is situated above the resonator section (on the side of the resonator section facing away from the substrate), so that the resonator section lies between the first isolation structure and the substrate, and the resonator then further comprises a second isolation structure situated between the resonator section and the substrate.

12 Claims, 10 Drawing Sheets

Fig. 9B

BULK ACOUSTIC WAVE RESONATOR WITH A CONDUCTIVE MIRROR

FIELD OF THE INVENTION

The present invention relates to bulk acoustic wave resonators, such as are used in providing bulk acoustic wave filters. More particularly, the present invention relates to bulk acoustic wave resonators with a particular variety of acoustic mirror, one including only metallic layers.

BACKGROUND OF THE INVENTION

A thin film bulk acoustical wave (BAW) filter can be fabricated on various substrates, such as silicon (Si), gallium arsenide (GaAs), or silicon dioxide ($SiO_2$). A thin film BAW filter often includes a shunt BAW resonator and a series BAW resonator, although some filters include only a series resonator and a shunt capacitor or only a shunt resonator and a series capacitor, and other resonators are based on topologies such as the lattice filter topology. A BAW filter including a series resonator and a shunt resonator could also include several such pairs of resonators so as to form what is called a ladder filter. Each BAW resonator includes a top electrode deposited atop a layer of piezoelectric material, which in turn sits atop a bottom electrode. The assembly of these three layers is sometimes referred to as the resonator section of a BAW resonator. A BAW resonator further includes other layers of materials, or different structural arrangements of materials, so as to finetune the performance of the BAW resonator.

Two types of BAW resonators are known in the art: a bridge type BAW resonator and an acoustic mirror type BAW resonator. In a bridge type BAW resonator, the resonator section is deposited on a membrane (made from one or more layers of different materials) and acoustic waves generated by the resonator are reflected back from the air interface above the top electrode, and from the air interface below the bottom electrode. In a mirror type of BAW resonator, the resonator is solidly mounted on top of a stack of layers making up what is called an acoustic mirror. The layers are selected to present to acoustic waves created by the resonator section alternately high and low acoustic impedance. Each layer of material in an acoustic mirror is typically one quarter of a wavelength thick. Such an acoustic mirror provides for a large reflection factor back toward the resonator for acoustic waves created by the resonator propagating in the direction of the acoustic mirror. There is also a reflection of the acoustic waves created by the resonator at the air interface at the top electrode.

Both types of BAW resonators have the disadvantage that they require a protective package with an air cavity over the resonator section. The packages typically used are similar to those used for SAW-filters, i.e. hermetic or at least semi-hermetic sealed ceramic packages. Such packages increase the size of the components and also the price. In addition, such packages create parasitic inductances and resistances.

What is needed is a structure that provides the required high-reflection factors both above and below a resonator section, and obviates the need for hermetic or semi-hermetic packaging with its attendant parasitic inductances and resistance and other disadvantages.

SUMMARY OF THE INVENTION

Accordingly, the present invention provides a method of fabricating a bulk acoustic wave (BAW) resonator and a BAW resonator so fabricated, the method including the steps of: providing a substrate; providing a first isolation structure; and providing a resonator section, the resonator section comprising a piezolayer; wherein the first isolation structure comprises an acoustic mirror made from only electrically conductive layers of alternating high and low acoustic impedance.

In a further aspect of the invention, a layer of the acoustic mirror abuts the piezolayer and serves as an electrode.

In another, further aspect of the invention, the first isolation structure is situated between the resonator section and the substrate.

In yet another, further aspect of the invention, the first isolation structure is situated above the resonator section, on the side of the resonator section facing away from the substrate, so that the resonator section lies between the first isolation structure and the substrate, and the method further comprises the step of providing a second isolation structure situated between the resonator section and the substrate. In some such applications, the second isolation structure includes an acoustic mirror made from layers of materials of alternating high and low acoustic impedance, and in other such applications, the second isolation structure includes a membrane. In yet still other such applications, the method of the invention also includes the step of providing a flip-chip ball on top of the first isolation structure.

In yet still another, further aspect of the invention, the method also includes the step of providing a capping material, the capping material positioned so that the first isolation structure and resonator section are sandwiched between the substrate and the capping material and so protected against mechanical loading, with an air interface between the resonator section and either the capping material or the substrate in case of the resonator including only a single isolation structure.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

Figure 1A:
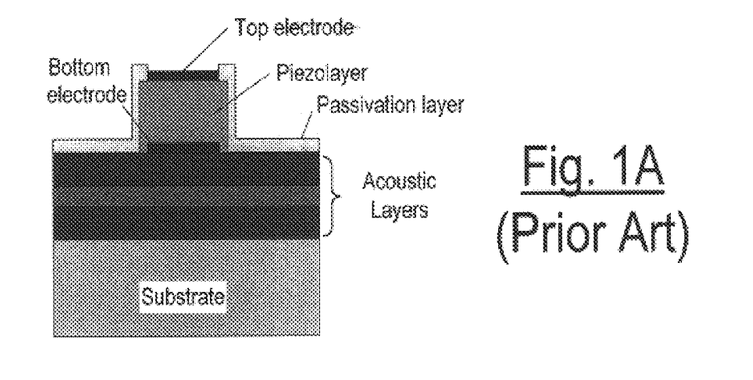
FIGS. 1A–C are elevation views of bulk acoustic wave resonators including an acoustic mirror, according to the prior art.
Figure 1B:
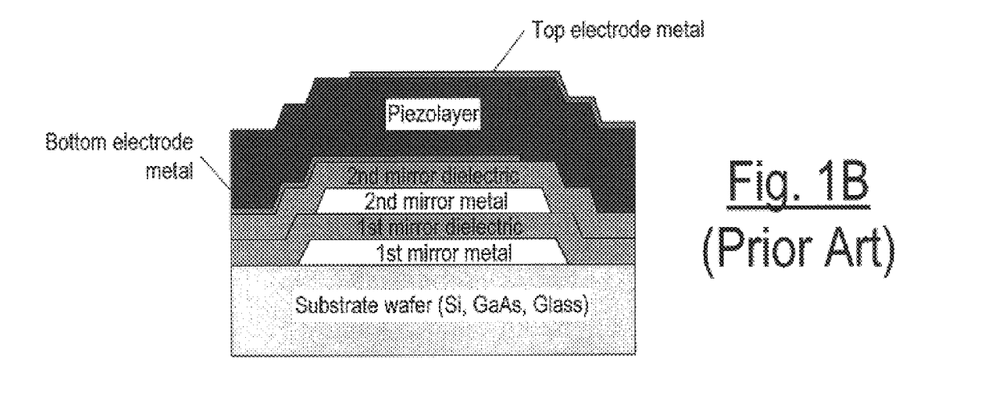
Figure 1C:
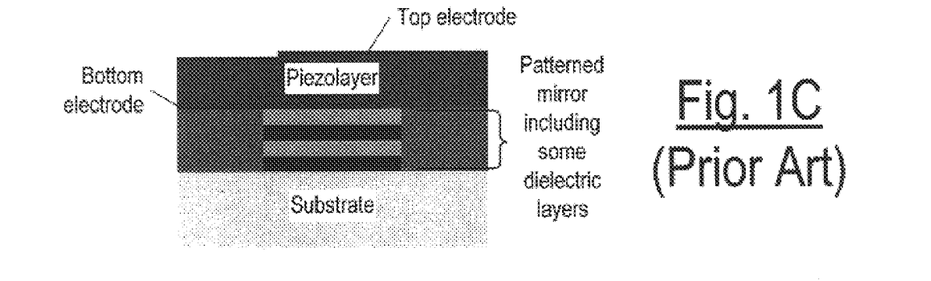

The preferred embodiment of the present invention is a BAW resonator based on the acoustic mirror type of BAW resonator. For purposes of distinguishing the invention clearly from the prior art, acoustic mirror type BAW resonators according to the prior art are shown in FIGS. 1A–C. FIG. 1A shows an acoustic mirror type BAW resonator (which could server as either the shunt resonator or the series resonator of a BAW filter) in which the resonator section, consisting of a top electrode, a piezolayer, and a bottom electrode are deposited on an acoustic mirror consisting of various layers of different materials, the materials having been selected to provide alternating high and low acoustic impedance, with each material of a thickness typically equal to one quarter of the wavelength of an acoustic wave at the center frequency of the BAW resonator (i.e. the frequency midway between the resonant frequency of the shunt resonator and the slightly different resonant frequency of the series resonator). The acoustic mirror layers are in turn deposited on a substrate, usually made of either silicon, gallium arsenide, or glass. The acoustic mirror can be considered an isolation structure, in that it helps confine acoustic waves to the piezolayer, mechanically (acoustically) isolating the piezolayer from the substrate (to which it would otherwise be well-coupled acoustically because it is bonded to the substrate).

When an acoustic mirror type BAW filter, consisting of at least one pair of series and shunt BAW resonators, is fabricated based on acoustic mirrors including one or more metallic layers, and the BAW resonators are mounted on a single substrate, at least the metallic layers of the acoustic mirror must be removed between resonator sections, a process called patterning the metallic layers of the acoustic mirror. FIG. 1B shows a structure where the acoustic mirror layers are consecutively deposited and the metallic layers are patterned, and more specifically, are confined to the region directly beneath the piezolayer.

It is also possible to pattern not simply the metallic layers, but all layers of an acoustic mirror. In such a fabrication, even the dielectric (low acoustic impedance) layers of the mirrors of the resonator section may be patterned, and a last step in such a fabrication is to deposit a thick layer of material over the pattern structure and to etch away the material so that the top of the structure is level with the top of the piezolayer, forming a flat plane. The structure is then said to be planarized. Such a planarized structure is shown in FIG. 1C. The prior art mirror can also consist of only dielectric layers, in which case the mirror does not have to be patterned at all. Such an all-dielectric mirror usually needs more layers to achieve the same reflectivity as mirrors that have a metallic layer as a high impedance layer.

Now according to the present invention, any of the different types of acoustic-mirror-based BAW resonators can be modified so as to eliminate the need for a protective packaging layer, by providing an acoustic mirror not only beneath the resonator section, but also above it. The basic idea of the invention is to fabricate the additional, top acoustic mirror out of only layers of conductive (metallic) materials (preferably aluminum and tungsten), making it possible to form electrical contact, through the top acoustic mirror, with the (optional) top electrode underneath the top mirror. (The top electrode is, strictly speaking, not needed since the mirror is conductive, but it makes fabrication easier.) Because the top mirror insulates the resonator section from any mass loading from above the top mirror, so-called flip-chip balls (bumps), enabling flip chip assembly can be placed directly on top of the top mirror. (The terminology flip chip assembly is used here to refer to the attachment of a bare die, also called a chip, to a so called motherboard, i.e. a printed circuit board, by first attaching solder balls (or bumps) to each pad of the chip. Next, the chip is "flipped" (turned upside down) and then placed on the ceramic or laminate-based circuit board. It is then usually heated in a re-flow oven so that the solder balls melt, attaching the flipped chip to corresponding pads on the motherboard.)

The number of layers making up the top mirror is determined based on the particular application, but as an example, the inventors fabricated an E-GSM receiver filter with three pairs of aluminum/tungsten layers for the top mirror and two pairs of silicon dioxide/tungsten layers for the bottom mirror.

Figure 5A:
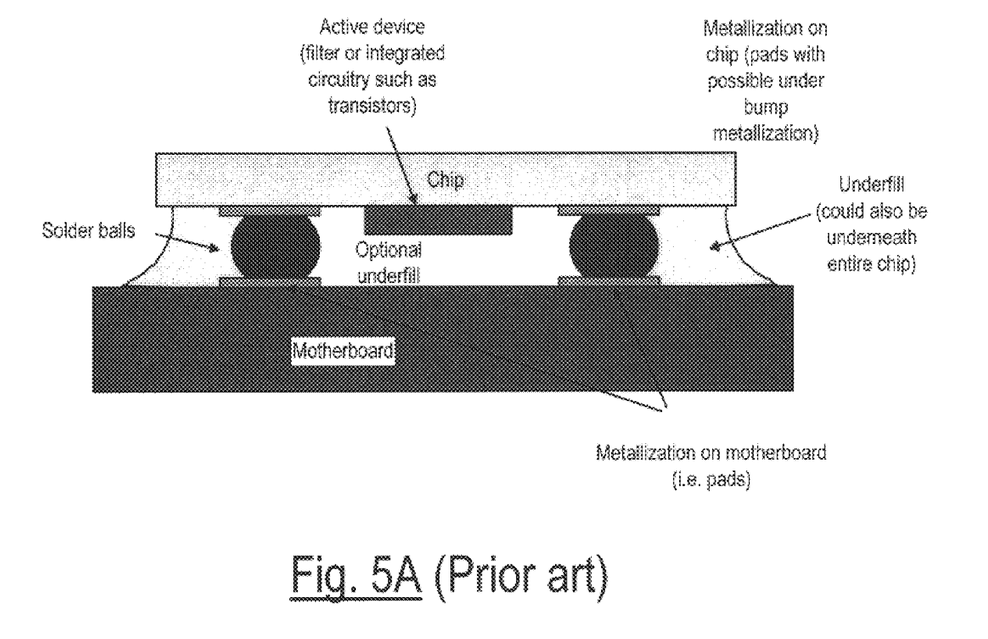
FIG. 5A is an elevation view of an integrated circuit component being fabricated using a flip chip assembly process, according to the prior art.

Flip-chip balls need not be placed directly on the top mirror; a flip-chip ball can also be provided adjacent the top mirror so that the top mirror need only protect against possible surface contaminants such as water vapor. With an off-mirror flip-chip ball, even a single mirror pair usually provides sufficient protection. Between the extremes of three pairs of layers for the top mirror providing full protection and a single pair of layers of material providing protection only against surface contaminants, lies the intermediate case of two pairs of layers, useful if for example underfill material is used so as to come into contact with the top mirror. (As illustrated in FIG. 5A, underfill is a glue-like material that is applied between a flipped chip and a motherboard to improve the mechanical reliability of the assembly. The chip is then fastened to the motherboard not only by the solder balls, but also by the underfill material.)

There are, of course, several ways to construct a top acoustic mirror. Two examples are described below, one with three pairs of layers for the top mirror, and flip-chip balls on top of the mirrors, and another with only one pair of layers of material for the top mirror and an off-mirror flip-chip ball.

Figures 2A, 2B, 2C, 2D:
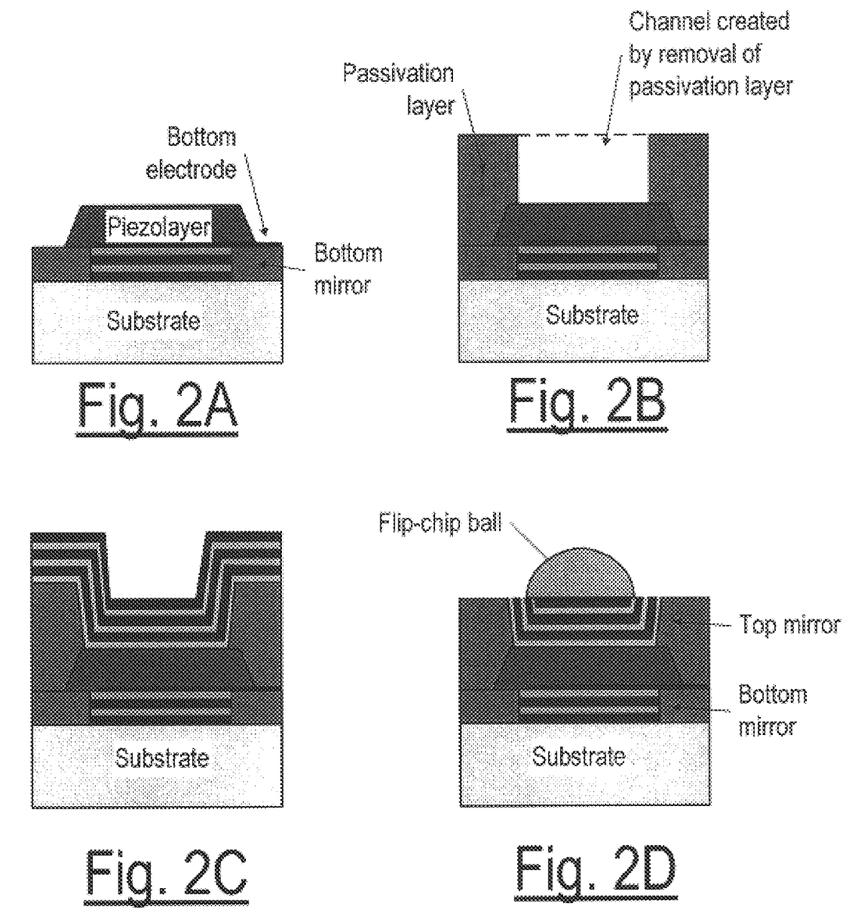
FIGS. 2A–E are elevation views of one embodiment of a bulk acoustic wave resonator including an acoustic mirror, according to the present invention, the different figures showing different stages in the fabrication of the bulk acoustic wave resonator, the last stage (FIG. 2D) providing a flip-chip bump, and also showing, as an alternative last stage (FIG. 2E), providing a bond wire instead of a flip-chip bump.
Figure 2E:
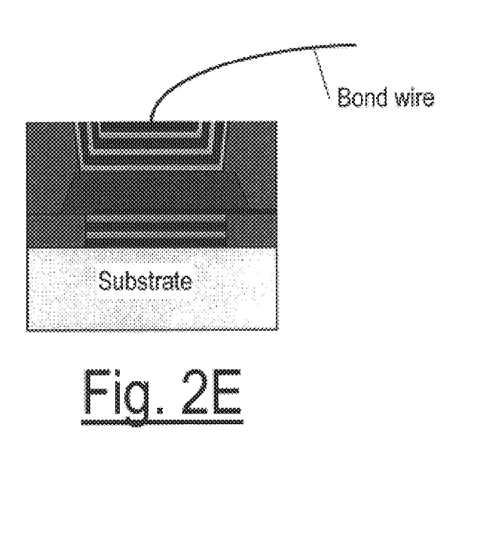

Referring now to FIGS. 2A–2D, a BAW resonator according to the present invention is shown as including both a bottom mirror (FIG. 2A) and a top mirror (FIG. 2D) with a flip-chip ball affixed atop the top mirror. In such a fabrication, according to the invention, after the bottom mirror is completed and the bottom electrode has been deposited and patterned, the piezolayer is deposited and, if required, patterned, as shown in FIG. 2A. Then, as shown in FIG. 2B, a thick passivation layer is deposited, and a channel is formed through the passivation layer extending down to the top of the piezolayer (or down to the top electrode); the channel is of a size so that the passivation material is removed essentially everywhere above the piezolayer. (For clarity, the top electrode and other optional layers are not shown, such as a shunt tuning layer. The top electrode would usually be deposited before the passivation layer.) Next, as shown in FIG. 2C, all the top mirror layers are deposited, one after the other. Once all the top layers have been deposited, the metallic layers of the top mirror are patterned (i.e. selectively removed everywhere except immediately above the piezolayer). The removal of the metallic layers is performed for example by Chemical Mechanical Polishing (CMP). Such a removal results in a smooth surfaced wafer, with the top mirror metals removed everywhere except inside the channel leading to the resonator (FIG. 2D). Next, the flip-chip ball is formed on top of the top mirror. Referring now also to FIG. 2E, instead of a flip-chip ball as shown in FIG. 2D, a wire bonded to the top mirror of the resonator may be used as a way of connecting the resonator to a circuit. The wire is connected to the top electrode, beneath the top mirror, through the electrically conductive mirror (the conductive mirror thereby serving not only as a mirror, but also as a kind of a via). The conductive mirror in such an embodiment serves as a pad for bumps or bond wires and also providing a connection to the surface of the piezolayer.

Figure 5B:
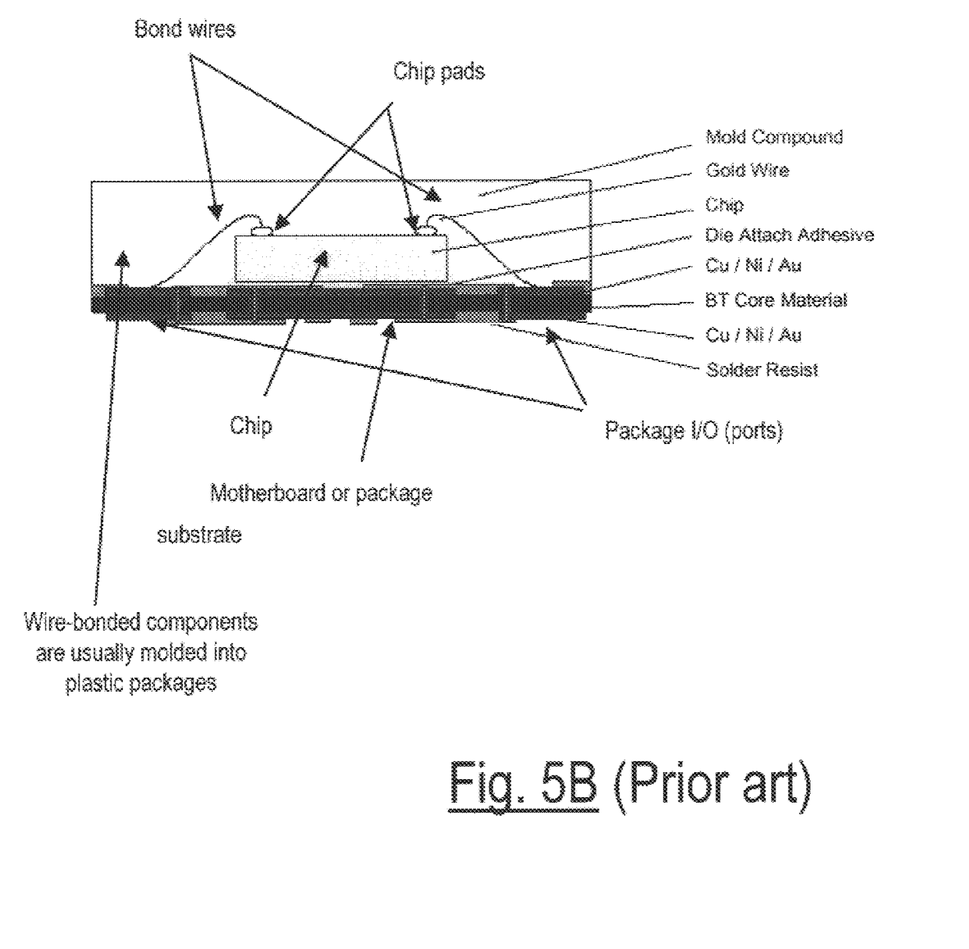
FIG. 5B is an elevation view of a wire-bonded assembly, according to the prior art.

Alternatively, instead of the above-described flip-chip assembly type process, the die can be sawed and wire-bonded as is. Any IC chip, such as the BAW filters of the present invention, must be provided with a means of being electrically connected to a circuit. Referring now to FIG. 5B, to provide such a connection, IC chips are often first wire-bonded to a lead frame and then plastic molded, resulting in a ready packaged component. Wire bonding is a method where, by use of 25 to 50 $\mu$ thick gold or silver wire, the IC input/output terminals are connected to the package input/output pins. The more modern method is the flip chip method, described above, where the connections created by wire bonds are replaced by solder bumps.)

The inventors constructed a receiver filter consisting of six resonators (three series resonators and three shunt resonators) based on double-layer acoustic mirror-type BAW resonators fabricated according to the above description. The interconnections from resonator to resonator were created using the bottom electrode metal and an additional metal on top of the finished top mirror, such as, for example, the under bump metal, or, in some cases, an additional top electrode metal on top of the piezolayer, below the top mirror. The terminology under bump metal is used for the metal layers between the I/O pads of an integrated chip; these metal layers are used to ensure chemical (metallurgical) compatibility of the solder ball with the I/O pads.

Figure 3A:
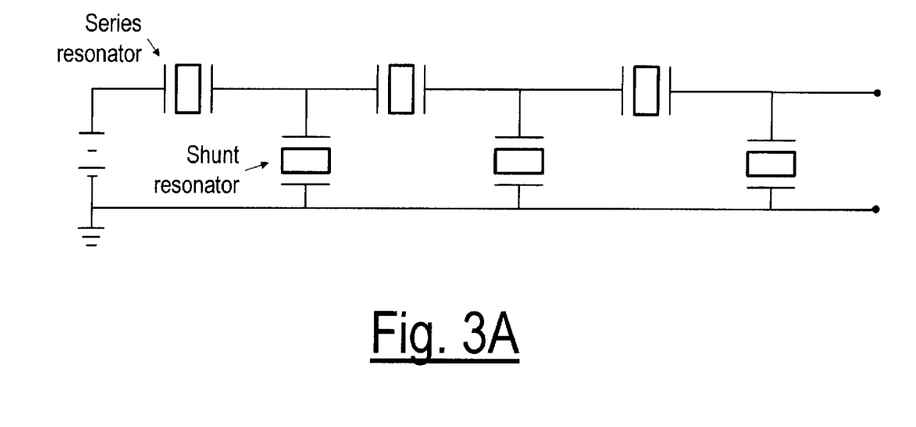
FIG. 3A is a schematic of a bulk acoustic wave filter consisting of three L-sections, each L-section consisting of a series bulk acoustic wave resonator and a shunt bulk acoustic wave resonator, each of the resonators indicated in the schematic being of a type fabricated according to the invention.
Figure 3B:
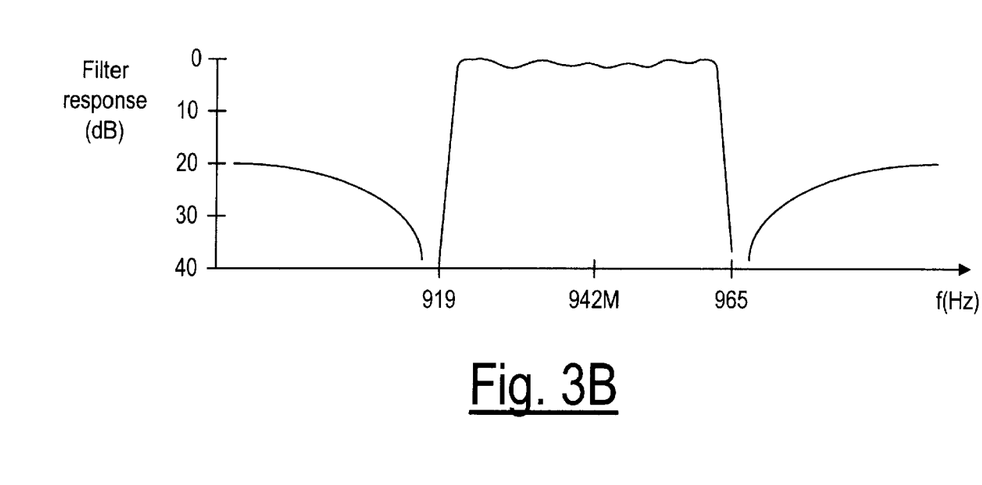
FIG. 3B is a plot of the response of the filter of FIG. 3A.

The shunt resonators were fabricated according to the same process, except for including an additional layer to decrease the resonant frequency so as to obtain the desired bandpass behavior of the filter. The additional layer was placed on top of the additional top electrode, but could have been placed below the bottom electrode. Moving from top to bottom, down to the substrate, the top mirror included three pairs of tungsten/aluminum layer pairs; a thin copper tuning layer for (only) the shunt resonator; an aluminum top electrode; a zinc oxide piezolayer; and a gold bottom electrode. Both resonators then included a bottom acoustic mirror consisting of two pairs of layers, one layer being silicon dioxide and the other layer being tungsten. The filter so constructed was a ladder-type BAW filter, consisting of three BAW filters connected in series, each BAW filter consisting of a series resonator and a shunt resonator. A schematic of the filter is shown in FIG. 3A, and the response of the filter is shown in FIG. 3B. The filter response was characteristic of a bandpass filter, with the maximum response centered at approximately 942 MHz, and with a bandwidth of approximately 35 MHz.

Figure 4:
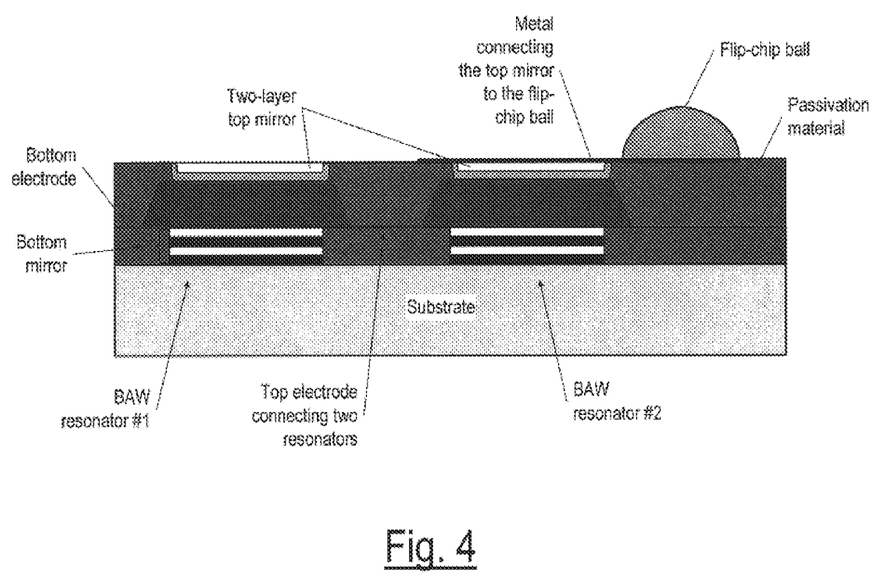
FIG. 4 is an elevation view of a filter consisting of a series resonator and a shunt resonator both mounted on a single substrate, and both fabricated according to the invention.

FIG. 4 shows part of a BAW filter (a shunt resonator and a series resonator) mounted on a single substrate, each BAW resonator fabricated according to the invention so as to include two acoustic mirrors. The two BAW resonators are shown interconnected through the top electrode. In addition, a flip-chip ball (for use in providing a signal port of the filter) is shown offset from either top mirror, and connected to one top mirror through a thin metallic layer. The interconnection of the resonators is shown being made using the top electrode.

General Discussion

One problem in fabricating a top mirror, as mentioned above, is how to stop the etching of the thick passivation layer during the channel creation step exactly at the surface of the piezolayer. One solution is to deposit and pattern a thin top electrode, on top of the piezolayer, prior to depositing the thick passivation layer. Doing so gives good selectivity, i.e. a significantly different etch rate for different materials. In creating the channel leading through the passivation layer to the piezolayer, in order to stop removing material as soon as reaching the top electrode on the piezolayer, it is desirable to have a high etch rate for the passivation layer and a low etch rate for the top electrode. Then once the etching (wet or dry) reaches the surface of the top electrode, it slows to such an extent that it can be said to have stopped.

Another problem is that the layers of a BAW resonator, especially the piezolayer, tend not to be of uniform thickness, and so there are variations across the wafer in the center frequency of a filter made of BAW resonators fabricated according to the prior art. The variation in the thickness of BAW layers can be compensated for by selectively depositing or removing material from areas where the frequency error is unacceptably large. Such adjusting can be performed on prior art resonators, but the thickness of the material that is to be removed or added is typically quite small. The use of a top mirror with only two layers has the advantage over the prior art that a BAW resonator so fabricated is fairly insensitive to surface contaminants on top of the top mirror. In addition, since adding or removing material to a structure can only be accomplished to within some absolute error (an error that varies significantly, depending on the material being deposited and the equipment being used) so that adding (or removing) more material has a smaller relative error than adding (or removing) less material, frequency trimming by adding material to a relatively thick top mirror can be performed with a relatively small relative error. For example, if in performing frequency trimming, an additional 20 nm (nanometers) must be deposited in the case of prior art resonators, and the thickness tolerance of the deposition is plus or minus 2 nm, the frequency trimming would have a relative accuracy of 10%; whereas, in adding material on top of a top mirror, the required overall thickness might be 80 nm, which. would again be deposited with an absolute error of 2 nm, providing a relative accuracy of 2½%.

Other Embodiments

Figure 6:
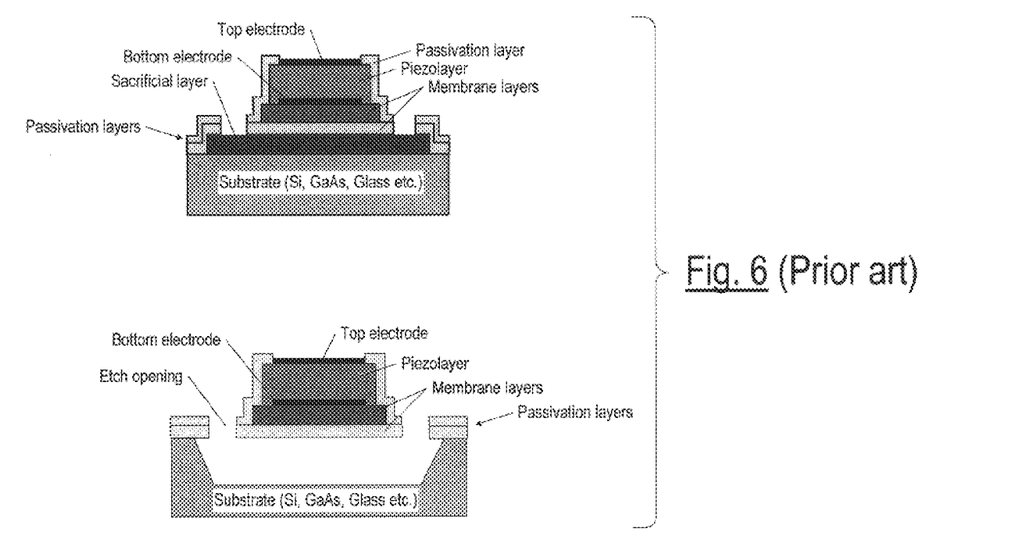
FIG. 6 is an elevation view of two types of bridge-type bulk acoustic wave resonators according to the prior art.
Figure 7:
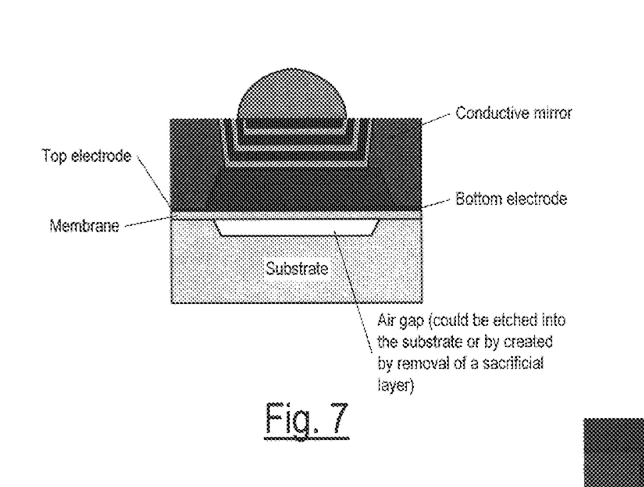
FIG. 7 is an elevation view of a bridge-type bulk acoustic wave resonator according to the present invention, having a conductive acoustic mirror on top of the top electrode.

The present invention also comprehends providing a bridge-type BAW resonator with an acoustic mirror on top of the resonator, although in the experience of the inventors, the preferred embodiment is a two-acoustic mirror (top and bottom mirrors) BAW resonator. Two kinds of bridge-type BAW resonators according to the prior art are shown in FIG. 6. Referring now to FIG. 7, to provide a bridge-type BAW resonator according to the invention, with a covering conductive acoustic mirror, first the resonator (including the membrane and the cavity underneath the membrane) is fabricated, and then the rest of the fabrication is performed in a way that is essentially identical to what is done in providing a BAW resonator with a bottom acoustic mirror instead of a membrane. The membrane of a bridge-type BAW resonator is another type of isolation structure.

Figure 8:
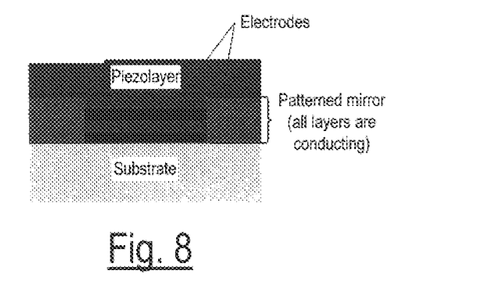
FIG. 8 is an elevation view of a bulk acoustic wave resonator according to the present invention, having a conductive acoustic mirror in place of, and at the same location as the usual (partly dielectric) type of acoustic mirror.

Referring now to FIG. 8, the present invention also comprehends making a BAW resonator with a bottom acoustic mirror, where the bottom mirror is made to be conductive (i.e. made out of only metallic layers) and then to make use of one or another kind of wafer level packaging. In other words, the resonators are fabricated as usual (with a bottom acoustic mirror) except for using only metals in the bottom mirror, but no top mirror is provided. Instead, after the wafer is finished (resonators and conductive mirrors), a capping wafer is attached to the top of the wafer containing the filters. The capping wafer has small pits in places of the filter to provide an air space above each filter active area (resonator). The capping wafer is attached to the filter wafer by anodic bonding, or by glue, or by solder. After the two wafers are joined, the original filter wafer is thinned and/or vias are opened from the backside to gain access to the bottom most layer of the conductive mirrors. The vias are then filled with solder balls, which then serve as the signal ports of the package.

There are a number of different ways to realize the signal port of a package. Filling vias with plugs and placing a bump on top is one way. Another way is to pattern metallisation and use off-mirror bumps, i.e. to deposit or grow a metal layer on the backside of an already capped, but not diced (not sawed) wafer, and then pattern the layer to form leads out of the pits to enable electrical contact from the bottom of the mirrors to the bumps, which are then off-mirror.

Figure 9A:
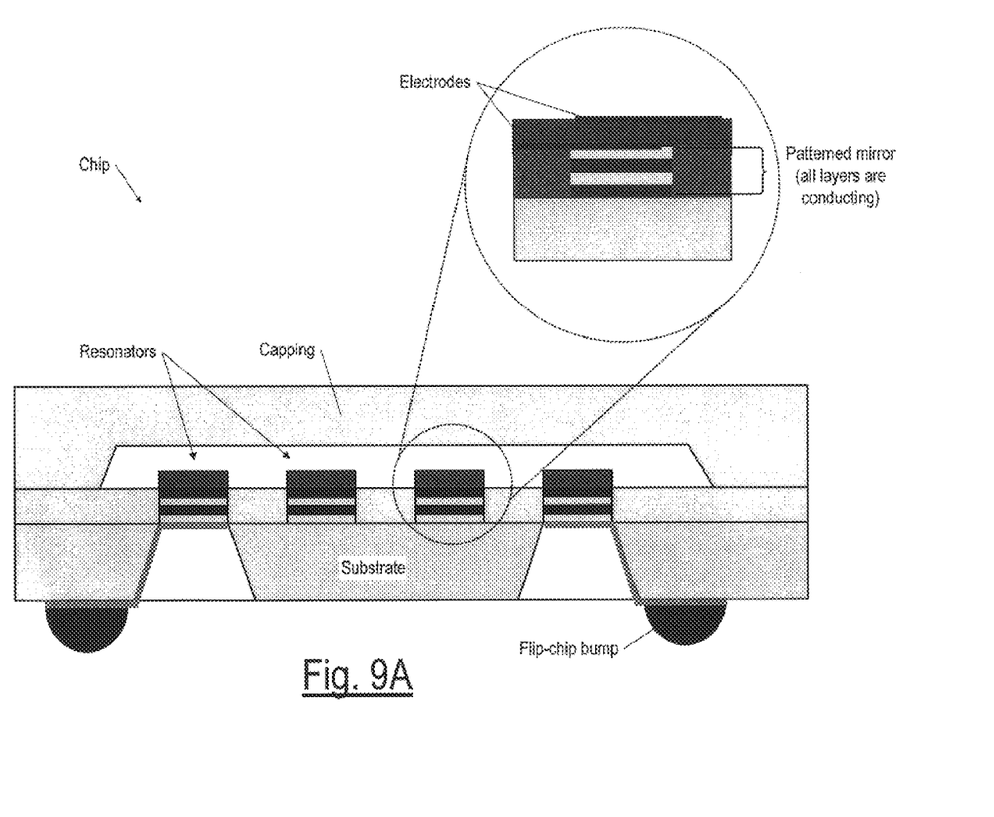
FIG. 9A is an elevation view of a wafer-level package of bulk wave resonators such as shown in FIG. 8, a package with off-mirror flip-chip bumps.
Figure 9B:
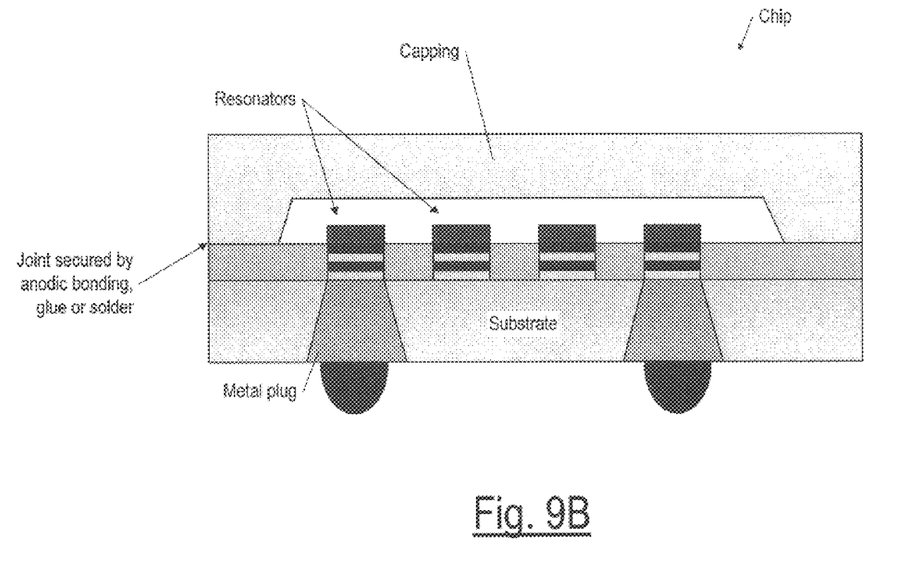
FIG. 9B is an elevation view of a wafer-level package of bulk wave resonators such as shown in FIG. 8, a package with on mirror flip-chip bumps.

FIG. 9A provides an elevation view of a wafer-level package of bulk wave resonators such as shown in FIG. 8, a package with off-mirror flip-chip bumps. FIG. 9B is an elevation view of a wafer-level package of bulk wave resonators such as shown in FIG. 8, a package with on-mirror flip-chip bumps. The capping shown in FIGS. 9A and 9B provides protection of the filter against mechanical loading. One of the problems of using a double-mirror resonator as one component of a filter (whether either mirror is all-conductive or not) is that the achievable bandwidth of the filter is somewhat narrower than for a filter including a resonator using only one mirror. Therefore any structure including resonators using only one mirror, but at the same providing protection by for example including a capping wafer such as shown in FIGS. 9A and 9B, is in some cases preferable.

Scope of the Invention

It is to be understood that the above-described arrangements are only illustrative of the application of the principles of the present invention. Numerous modifications and alternative arrangements may be devised by those skilled in the art without departing from the spirit and scope of the present invention, and the appended claims are intended to cover such modifications and arrangements.

What is claimed is:

1. A method of fabricating a bulk acoustic wave (BAW) resonator, comprising the steps of:
   a) providing a substrate;
   b) providing a first isolation structure; and
   c) providing a resonator section, the resonator section comprising a piezolayer;
   wherein the first isolation structure comprises an acoustic mirror made from only electrically conductive layers of alternating high and low acoustic impedance, further wherein the first isolation structure is provided so as to be situated above the resonator section, on the side of the resonator section facing away from the substrate, so that the resonator section lies between the first isolation structure and the substrate, and wherein the method further comprises the step of providing a flip-chip ball on top of the first isolation structure.

2. The method of claim 1, wherein a layer of the acoustic mirror abuts the piezolayer and serves as an electrode.

3. A method as in claim 1, further comprising the step of providing a capping material, the capping material positioned so that the first isolation structure and resonator section are sandwiched between the substrate and the capping material and so protected against mechanical loading, with an air interface between the resonator section and either the capping material or the substrate in case of the resonator including only a single isolation structure.

4. A method as in claim 1, further comprising the step of providing a second isolation structure situated between the resonator section and the substrate.

5. A method as in claim 4, wherein the second isolation structure comprises an acoustic mirror made from layers of materials of alternating high and low acoustic impedance.

6. A method as in claim 4, wherein the second isolation structure comprises a membrane.

7. A bulk acoustic wave (BAW) resonator, comprising:
   a) a substrate;
   b) a first isolation structure; and
   c) a resonator section, the resonator section comprising a piezolayer;
   wherein the first isolation structure comprises an acoustic mirror made from only electrically conductive layers of alternating high and low acoustic impedance, further wherein the first isolation structure is situated above the resonator section, on the side of the resonator section facing away from the substrate, so that the resonator section lies between the first isolation structure and the substrate, and wherein the BAW resonator further comprises a flip-chip ball on top of the first isolation structure.

8. A BAW resonator as in claim 7, wherein a layer of the acoustic mirror abuts the piezolayer and serves as an electrode.

9. A BAW resonator as in claim 7, further comprising a second isolation structure situated between the resonator section and the substrate.

10. A BAW resonator as in claim 9, wherein the second isolation structure comprises an acoustic mirror made from layers of materials of alternating high and low acoustic impedance.

11. A BAW resonator as in claim 9, wherein the second isolation structure comprises a membrane.

12. A BAW resonator as in claim 7, further comprising a capping material, the capping material positioned so that the first isolation structure and resonator section are sandwiched between the substrate and the capping material and so protected against mechanical loading, with an air interface between the resonator section and either the capping material or the substrate in case of the resonator including only a single isolation structure.

* * * * *

UNITED STATES PATENT AND TRADEMARK OFFICE
CERTIFICATE OF CORRECTION

PATENT NO. : 6,509,813 B2  
DATED : January 21, 2003  
INVENTOR(S) : Juha Ellä and Jyrki Kaitila It is certified that error appears in the above-identified patent and that said Letters Patent is hereby corrected as shown below:

Column 3,
Line 17, "with on mirror" should be -- with on-mirror --.

Column 6,
Line 62, after "which. would" should be -- which would --.

Signed and Sealed this

Twenty-fifth Day of March, 2003

JAMES E. ROGAN
*Director of the United States Patent and Trademark Office*